United States Patent [19]

Richards

[11] 4,037,170
[45] July 19, 1977

[54] DIFFERENCE AMPLIFIER HAVING EXTENDED COMMON MODE RANGE

[75] Inventor: Glenn L. Richards, Rochester, N.Y.

[73] Assignee: Stromberg-Carlson Corporation, Rochester, N.Y.

[21] Appl. No.: 673,827

[22] Filed: Apr. 5, 1976

[51] Int. Cl.² .............................................. H03F 3/45
[52] U.S. Cl. ................................... 330/69; 179/1 A; 330/30 D; 330/108
[58] Field of Search ...................... 330/30 D, 69, 108; 179/1 A

[56] References Cited
U.S. PATENT DOCUMENTS 3,972,006  7/1976  Ruegg ............................ 330/108 X

OTHER PUBLICATIONS

Ritter – "Controlling Op-Amp Gain with One Potentiometer" – Electronics, p. 78; July 1972.

Primary Examiner—Rudolph V. Rolinec
Assistant Examiner—Lawrence J. Dahl
Attorney, Agent, or Firm—William F. Porter, Jr.

[57] ABSTRACT

A difference amplifier, the construction of which includes operational amplifier, has an extended amplitude range of common mode signal. The input of the circuit which is applied to the inversion input of the operating amplifier is applied to the latter through an attenuation network. An adjustment of the other resistor values in the circuit is made to appropriately retain the desirable characteristics of keeping common mode rejection.

5 Claims, 2 Drawing Figures

DIFFERENCE AMPLIFIER HAVING EXTENDED COMMON MODE RANGE

BACKGROUND OF THE INVENTION

Field of the Invention

The present invention relates to operational amplifier type difference circuits, and more particularly to such circuits which are used as differential input-to-single-ended output converters and which have a capability to reject common mode signals.

Description of the Prior Art

The use of difference amplifiers employing operational amplifiers for the purpose of conversion of a differential input signal to a single-ended output signal, and the employment of the inherent characteristics of the circuit to reject any unwanted common mode signal is well known. Prior to the present invention, the range of amplitude of common mode signal rejection capability for such circuits with unity gain has generally been limited to peak-to-peak amplitudes approaching twice the difference of the positive and negative voltage supplies for the operational amplifier circuit.

While this range of rejection capability is adequate for many purposes there are applications for which a greater range of common mode rejection capability is desired. One such application is in conjunction with multi-frequency tone receiver equipment for telephonic call processing systems. In such equipments there is a possibility of presence of unwanted common mode signals in wire pairs designed to carry balanced, or differential signals, with the common mode signals reaching peak magnitudes as high as 50 volts.

Accordingly, an object of the present invention is to provide operational amplifier construction of difference amplifier circuit having a range of common mode signal rejection capability which is greatly extended beyond the nominal limit of peak-to-peak common mode signals equal to twice the power supply voltage magnitude for the operational amplifier circuit while retaining a gain for the differential signal equal to unity.

Another object is to provide a circuit in accordance with the previous object and further of a construction which may be adapted to different requirements by simple changes in resistive component values.

SUMMARY OF THE INVENTION

The conversion of a differential signal to a single-ended output is provided by the differential action of an operational amplifier acting on a pair of inputs which are separately applied to the non-inverting, and the inverting, inputs of the operational amplifier. The input for receiving one of the differential signals and applying same to the non-inverting input of the operational amplifier does this via an attenuation network consisting of an input resistor connected to the non-inverting input and a ground return resistor connected between the non-inverting input and ground. The input for receiving the other differential signal and applying same to the inverting input of the operational amplifier does this via another attenuation network consisting of an input resistor connected to the inverting input of the operational amplifier and a ground return resistor connected between the inverting input of the operational amplifier and ground. A feedback resistor is connected between the output of the operational amplifier and its inverting input. The value of the ground-return resistor between the inverting input of the operational amplifier and ground, and the values of the other resistors are properly sized with respect to one another to provide substantially equal impedances to a common mode signal present at both of the circuit inputs, and to otherwise provide characteristics which maintain the common mode rejection by the operational amplifier. The attenuation network through which one of the inputs is applied to the non-inverting input is chosen to establish the voltage range which can be tolerated for a given common mode range of the operational amplifier input terminal. For example, if the voltage range which can be tolerated at the input terminal is plus or minus 5 volts, the provision of an attenuation network yielding a 10-to-1 attenuation provides a common mode range at the circuit input of plus or minus 50 volts. This attenuation must in effect be "made up" by having the gain of the circuit to differential signal sufficiently high. The ratio of the feedback resistor to the input resistor of the attenuator network employed in applying the other differential signal to the inverting input of the operational amplifier essentially establishes the overall circuit gain. Another relationship involving the feedback resistor must also be satisfied, this relationship is that the parallel resistance of the feedback resistor and the ground-return resistor between the inverting input of the operational amplifier and ground be equal to the value of the ground-return resistor between the non-inverting input of the operational amplifier and ground. The input resistors of the respective attenuator networks are of equal value, and for a unity gain configuration of the circuit they are also equal to the feedback resistor.

DESCRIPTION OF THE PREFERRED EMBODIMENT

Figure 1:
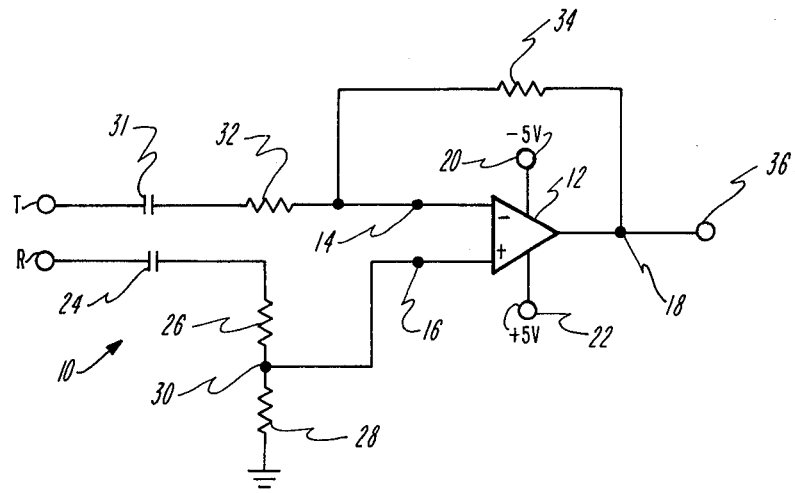
FIG. 1 is partially an electrical schematic and partially a block diagram of a prior art difference amplifier.

Referring now to the drawing, and in particular to FIG. 1, a prior art difference amplifier 10 will be described with reference to its use in an application in the field of telephony for the purposes of converting a differential signal to a single-ended signal, and for purposes of rejecting any common mode signal which is present along with the differential signal. Terminals T and R form the inputs for circuit 10. Together they form a pair of inputs for the Tip and Ring wires of a telephone circuit. An exemplary application would be two wires of a conventional circuit in which the line circuit signal is applied as a differential signal to these terminals. In such exemplary application the authorized signal communicated by the circuit comprises a potential applied to one of the terminals which is equal to, but 180° out of phase with respect to the potential applied to the other, with the respective potentials balanced with respect to common ground. The active element of circuit 10 is typically a conventional integrated circuit operational amplifier 12. Operational amplifier 12 has two input pins, or terminals, consisting of an inverting input terminal 14 and a non-inverting input terminal 16. The output of the operational amplifier is provided at an output pin, or terminal 18. The necessary power supply voltages for operation of amplifier 12 consists of a −5 volts supply at a terminal 20, and a +5 volts supply at a terminal 22. The input signal received at terminal R is applied to non-inverting input terminal 16 of the operational amplifier via an input network including a D.C. decoupling capacitor 24, a resistor 26, and a resistor 28. Resistors 26 and 28 are serially connected between the decoupling capacitor and ground, and the signal appearing at the node 30 therebetween is applied to non-inverting input terminal 16 of operational amplifier 12. The signal received at circuit input terminal T is applied to the inverting terminal 14 of operational amplifier 12 via a network consisting of a D.C. decoupling capacitor 24 and a resistor 32 serially connected between circuit terminal T and inverting input terminal 14. A feedback resistor 34 is connected between output terminal 18 and input terminal 14 of operational amplifier 12. The output terminal 18 of operational amplifier 12 is connected to a terminal 36 which is the output terminal of the difference amplifier circuit 10. A typical application for difference amplifier circuit 10 is a buffer function and therefore it often has an overall gain of unity. For this situation, the values of resistors 26, 28, 32, and 34 are equal.

The operation of prior art circuit 10 as follows. The signal received at terminal R, consists of the authorized differential signal upon which is superimposed the unauthorized common mode signal, is divided by 2 by the voltage dividing action of resistors 26 and 28. This divided potential is applied to non-inverting terminal 16. In accordance with the well-known principles of operation of an operational amplifier configured with a feedback resistor between its output and its inverting input, operational amplifier 12 will maintain the potential at its inverting input terminal 14 virtually equal to that at input terminal 16. Also in accordance with well-known principles of operation of an operational amplifier 12 configured with feedback resistor 34, this causes differences of the potential applied to terminals T and R to be amplified with unity gain at output terminal 36. However, the common mode component which causes terminals R and T to vary in the same direction by the same amount rather than differentially, are cancelled, or "ignored" by the action of the circuit. The operating characteristic by which a circuit 10 ignores the common mode signal is called its common mode rejection capability.

The present invention, which will be described in conjunction with FIG. 2, involves the concept of range of common mode signal amplitudes over which this rejection capability is effective. In order to set the stage for a description of FIG. 2, the effect of various amplitudes of common mode signals upon circuit 10 is presently explored. The dynamic range of operational amplifier 12 is limited to approximately the power supply of voltages of plus or minus 5 volts. Assume that a common mode voltage which together with the differential voltage produces a total peak-to-peak signal amplitude at terminal R causing a maximum positive swing of 10 volts. The division of two caused by the network of resistors 26 and 28 causes a maximum positive swing of 5 volts to appear at non-inverting terminal 16 which is the limit which operational amplifier 12 can tolerate. Assume now that a common mode range signal of 50 volts appears. It would try to swing the non-inverting input terminal to 25 volts, which would exceed the limits of operational amplifier 12. This would cause the operational amplifier to operate in a non-linear manner and thereby provide feed-through of the common mode signal at terminal 36. Alternatively, it could cause damage to the integrated circuit structure of operational amplifier 12. Circumvention of the problem could be attempted by a choice of values of resistors 26 and 28 to attenuate the common mode signal at input terminal 16 to 1/10 its magnitude at the input terminal. Such a solution would indeed enable circuit 10 to tolerate a 50 volt common mode signal, and would in effect increase the common mode range of this circuit. However, the consequence of changing the values of the resistors would cause circuit 10 to have an overall voltage gain of 0.1, so that a differential signal between terminals T and R would be attenuated by a factor of 10 at the circuit output terminal 36.

Figure 2:
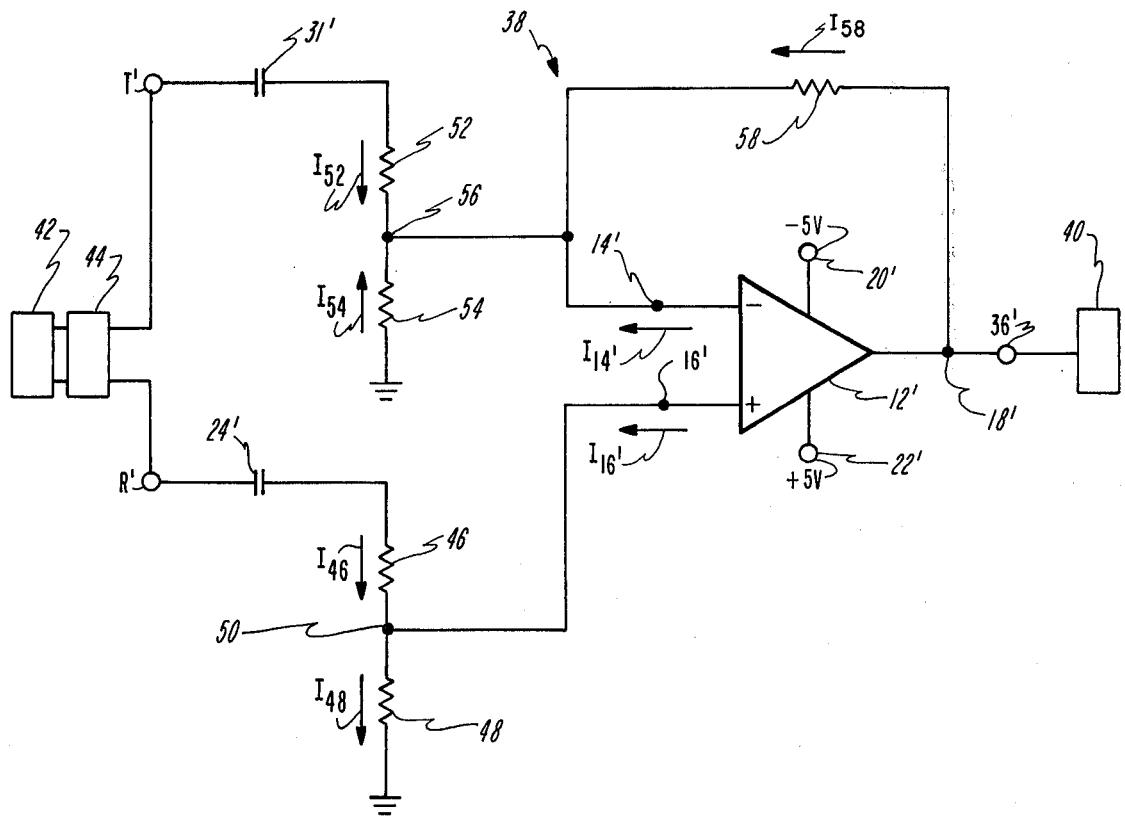
FIG. 2 is partially an electrical schematic and partially a block diagram of a difference amplifier in accordance with the present invention.

Referring now to FIG. 2, a difference amplifier circuit 38 built in accordance with the present invention has an extended range of common mode rejection capability. Circuit 38 provides a common mode rejection of 50 volts as will be described. The construction of circuits 38 and 10 have certain components which may, for purposes of their description be considered the same. These are indicated in FIG. 2 by use of the same reference character applied to FIG. 1, but followed by a prime (') symbol. Circuit 38 is in an illustrative application of an input buffer amplifier to a multiple-frequency tone receiver apparatus 40 contained in a PBX system. That is to say the output terminal 36' provides the single-ended signal to tone receiver 40. The inputs received at circit input terminals R' and T' come from a PBX system line circuit interface 42 via the switching matrix 44 of the PBX system. The design objective for circuit 38 is to have an extended range of common mode signal rejection capability as a precaution against the possiblity of excessive amplitude of power line signals. However, the relationship of component values illustrated herein for circuit 38 provide a gain of unity. As will be apparent from the ensuing description, the circuit may be made to have any gain within a wide range of gains by choice of values of resistors in its resistor networks.

The input received at R' is applied to the non-inverting input of operational amplifier 12' via a resistor voltage divider consisting of resistors 46 and 48. The potential at the node 50 therebetween is applied to non-inverting input 16' of operational amplifier 12'. The signal received at circuit input terminal T' is applied to the inverting input 14' of operational amplifier 12' via a voltage divider network consisting of resistors 52 and 54. The potential at node 56 therebetween is directly coupled to inverting input 14' of operational amplifier 12'. A feedback resistor 58 is connected between the output terminal 18' and the inverting input terminal 14' of operational amplifier 12'.

The values of resistors 46, 48, 52, 54 and 58 are chosen to cause this configuration to provide common mode signal rejection capability and further to do this over a dynamic range of common mode signal amplitudes at the input terminals which is extended beyond that provided by the prior art circuit 10. The procedure for calculating these values of resistors is as follows:

1. Specify the required tolerance of voltages of common mode signals, $V_{CMIN}$ at circuit terminals R' and T'. In the illustrative application of a buffer amplifier for tone receiver 40 following line circuit interface 42 and switching matrix 44 in a PBX system, the required range is 50 volts.

2. Specify the limits of common mode signal which can be tolerated at the operational amplifier inputs, $V_{CM12}'$. For The illustrative input buffer application in the PBX tone receiver, the limits are ±5 volts 3. In order to reduce a common mode signal at the limits of the required tolerance of range of voltage to limits which can be tolerated at the inputs of operational amplifier 12', the necessary common mode attenuation must be provided in accordance with the following general relationsip:

$$V_{CM12}'/V_{CMIN} = R_{48}/(R_{48}+R_{46})$$

The common mode range gain, $A_{CM}$, is thus:
$$V_{CMIN}/V_{CM12}' = (R_{48}+R_{46})/R_{48}.$$

(It will be appreciated that as in the prior art, $R_{46} = R_{48}$ where $A_{CM} = 2$.) Thus, for the illustrative input buffer application in a PBX tone receiver the following specific relationship must be provided:

$$V_{CMIN}/V_{CM12} = 10 = (R_{46}+R_{48})/R_{48} = A_{CM}$$

4. In accordance with well-known fundamentals of circuit design, a requirement of effective common mode rejection is that $Z_T' = Z_R'$, where $Z_T'$ is the input impedance for a common mode signal at input terminal T', and $Z_R'$ is the input impedance for a common mode signal at a terminal R'. It follows from accepted principles of circuit analysis that $R_{46} = R_{52}$. A detailed disclosure of this analysis is presented in Appendix A to this specification.

5. Differential gain, $A_D$, is defined mathematically, $$A_D = V_{36}'/(V_R'-V_I')$$

This differential gain is to be specified in accordance with the requirements of the application. For example, in the case of an embodiment of circuit 38 which is to have a gain of 0db, $A_D = 1.0$.

6. In accordance with the relationships developed in Appendix C ending with equaltion (33), $A_D$ may be expressed as follows:

$$A_D = R_{58}/R_{52}$$

7. By employing the relationships $R_{52} = R_{46}$ (discussed in paragraph No. 4) in conjunction with the accepted principles of analysis of the relationship of circuit output voltage to the resistive networks of an operational amplifier, it can be shown that the value of resistor 54 may be expressed by the following relationship:

$$R_{54} = (R_{58} \cdot R_{48})/(R_{58}-R_{48})$$

The analytical derivation of this equation is disclosed in Appendices B and C.

8. In Appendix D there are derived and disclosed certain equations which express the values of resistors 48, 58, and 54 in terms of the specified differential gain, $A_D$, and the required common mode input signal gain $A_{CM}$, and resistance value $R_{52}$. A selection of the value, $R_{52}$, is made to suit other application requirements and resistors 48, 58 and 54 are sized in accordance with these formulae.

Proper selection of values of resistors in accordance with foregoing procedures provides: (i) equal common mode input impedances at terminals R' and I', and (ii) retention of effective common mode rejection capability of the overall circuit by using equal common mode gain from each terminal to the output.

In operation, circuit 38 allows the natural common mode rejection characteristics of an operational amplifier-type difference amplifier to reject the common mode signal as reduced in amplitude from what it would be at the circuit input terminals. Thus, the common mode signal is kept within the amplifier input voltage range. The differential signal at the circuit input terminals R' amnd T' is also attenuated by the same amount. However, by the choice of resistance values, and more specifically the values of resistors 58 and 52 the attenuation of the differential signal will be recovered to the extent required by the application. It is primarily the sizing of resistors 52 and 46 which causes equivalency of the impedance presented to a common mode signal at terminal T' to that present at terminal R'. Resistor 54, which constitutes a ground return path between inverting input terminal 14' and ground is an additional component which was not at all present in prior art circuit 10. The values of components for circuit 38 which will be hereinafter presented are appropriate for the illustrative buffer amplifier amplication in a PBX toner receiver. Circuit 38, constructed with such values of components, can withstand a common mode range of ±50 volts and still provide effective common mode rejection.

It will be appreciated that what has been provided is a difference amplifier which retains its capability of providing unity gain (or whatever gain is dictated by application requirements) for an extended range of common mode signal.

Values of the components for circuit 38 are as listed in the table which follows. The circuit value given in the table and not enclosed by parenthesis are for both the case of a gain of −3db and a gain of unity, unless followed by a value enclosed by parenthesis. Where both a value not enclosed by parenthesis and a value closed by parenthesis is given, the former is for the case of −3db gain and the latter is for the case of unity gain.

| Capacitors 24 & 31: | 0.01 microfared |
|---|---|
| Resistors 52 & 46: | 100 K ohm |
| Resistor 48: | 11.11 K ohm |
| Resistor 54: | 13.18 (12.5) K ohm |
| Resistor 58: | 70.7 (100) K ohm |

Operational amplifier 12' is a type MC1741 manufactured by Motorola of Phoenix, Ariz.

It will be understood by those skilled in the art that numerous variations and modifications may be affected to the preferred embodiment without departing from the spirit and scope of the invention hereinafter claimed.

APPENDIX A

Analytical Determination of Input Impedances for Circuit 38, FIG. 2, and Derivation of the Relationship $R_{46} = R_{52}$ The following assumptions [1] are made:
 (i) $A_{12}' \simeq \infty$, where $A_{12}'$ is the internal gain of operational amplifier 12'.
 (ii) $V_{16}' = V_{14}'$, where $V_{16}'$ and $V_{14}'$ are the instantaneous voltages at input terminals 14' and 16' of operational amplifier 12'.
 (iii) $I_{14}' = I_{16}' = O$, where $I_{14}'$ and $I_{16}'$ are the current at input terminals 14' and 16'.
Determine Input Impedances $Z_R'$ and $Z_T'$:

(1) $V_{14}' = V_{16}' = \dfrac{V_R' \cdot R_{48}}{R_{46} + R_{48}}$    ($V_{16}$ is simply $V_R'$ through a voltage divider)

(2) $I_{52} + I_{58} + I_{54} = O$    (Sum of currents into

APPENDIX A-continued

Analytical Determination of Input Impedances for Circuit 38, FIG. 2, and Derivation of the Relationship $R_{46} = R_{52}$

(3) $I_{46} = I_{48}$ — (Since $I_{16}' = 0$) (a node is zero)

(4) $I_{52} = \dfrac{V_T' - V_{14}'}{R_{52}}$ — (Current = voltage ÷ resistance)

(5) $I_{58} = \dfrac{V_{36}' - V_{14}'}{R_{58}}$ — (Current = voltage ÷ resistance)

(6) $I_{54} = \dfrac{0 - V_{14}'}{R_{54}}$ — "

(7) $Z_R' = \dfrac{V_R'}{I_{46}} = R_{46} + R_{48}$ — (Resistance = voltage ÷ current, resistance obtained by inspection)

(8) $Z_T' = \dfrac{V_T'}{I_{52}} = \dfrac{V_T'}{\dfrac{V_T' - V_{14}'}{R_{52}}}$ — (Substituting Eq. (4) for $I_{52}$)

(9) $Z_T' = \dfrac{V_T'}{\dfrac{V_T' - \dfrac{V_R' \cdot R_{48}}{R_{46} + R_{48}}}{R_{52}}}$ — (Substituting Eq. (1) for $V_{14}'$)

(10) $Z_T' = \dfrac{V_T' \cdot R_{52}}{V_T' - \dfrac{V_R' \cdot R_{48}}{R_{46} + R_{48}}}$ — (Rearranging Eq. (9))

(11) $Z_T' = \dfrac{R_{52}}{1 - \dfrac{V_R'}{V_T'} \cdot \dfrac{R_{48}}{R_{46} + R_{48}}}$ — (Rearranging Eq. (10))

(12) $Z_T' = \dfrac{R_{52}}{1 - \dfrac{R_{48}}{R_{46} + R_{48}}}$ — (Calculation of $Z_T'$ for the common mode condition, i.e. $V_R' = V_T'/2$.)

It is axiomatic that for best common mode rejection, $Z_T' = Z_R'$

(13) $\dfrac{R_{52}}{1 - \dfrac{R_{48}}{R_{46} + R_{48}}} = R_{46} + R_{48}$ — (Setting Eqs. (12) = (7))

(14) $\dfrac{R_{52}}{R_{46}} = 1$ — (Divide both sides by $R_{46} + R_{48}$)

(15) $R_{46} = R_{54}$ — (Requirement for common mode operation)

Footnotes:
[1] These assumptions follow from the well known principle of operational amplifier operation that the differential input voltage between terminals 14' and 16' is very small compared to other signal components.
[2] Note that there are two other conditions for which $Z_T'$ could be formulated, namely: (i) the condition of a differential mode signal, and (ii) the condition that $V_T'$ and $V_R'$ are independent. For the condition of a differential mode signal $V_R' = -V_T$; and therefore $Z_T'$ would be formulated as:

$$Z_T' \quad \dfrac{R_{52}}{1 + \dfrac{R_{48}}{R_{46} + R_{48}}}.$$

The formulation of $Z_T'$ for situations of $V_T'$ and $V_R'$ being independent will vary from case to case. For example for the situation in which $V_T'$ varies $V_R'$ remains fixed at zero, $Z_T' = R_{52}$.

APPENDIX B

Derivation of an Equation for $V_{36}'$

(16) $V_{36}' = V_{14}' + I_{58} \cdot R_{58}$ — (By inspection)

(17) $I_{58} = -(I_{52} + I_{54})$ — (From Eq. (2), Appendix A)

(18) $I_{58} = -\left(\dfrac{V_T' - V_{14}'}{R_{52}} + \dfrac{0 - V_{14}'}{R_{54}}\right)$ — (Using Eqs. (4) & (6), Appendix A)

(19) $I_{58} = -\dfrac{V_T'}{R_{52}} + \dfrac{V_{14}'}{R_{52}} + \dfrac{V_{14}'}{R_{54}}$ — (Rearranging Eq. (18))

(20) $V_{36}' = V_{14}' + R_{58}\left(\dfrac{V_{14}'}{R_{52}} + \dfrac{V_{14}'}{R_{54}} - \dfrac{V_T'}{R_{52}}\right)$ — (Substituting Eq. (19) into Eq. (16))

(21) $V_{36}' = V_{14}'\left(1 + \dfrac{R_{58}}{R_{52}} + \dfrac{R_{58}}{R_{54}}\right) - V_T'\dfrac{R_{58}}{R_{52}}$ — (Rearranging Eq. (20))

(22) $V_{36}' = V_R'\dfrac{R_{48}}{R_{46} + R_{48}}\left(1 + \dfrac{R_{58}}{R_{52}} + \dfrac{R_{58}}{R_{54}}\right) - V_T'\dfrac{R_{58}}{R_{52}}$ — (Substituting Eq. (1), Appendix A, into Eq. (21))

(23) $V_{36}' = V_R'\dfrac{R_{48}}{R_{52} + R_{48}}\left(\dfrac{R_{58}}{R_{58}} + \dfrac{R_{58}}{R_{52}} + \dfrac{R_{58}}{R_{54}}\right) - V_T'\dfrac{R_{58}}{R_{52}}$ — (Substituting Eq. (15) into Eq. (22))

(24) $V_{36}' = V_R'\dfrac{R_{58} \cdot R_{48}}{R_{52} + R_{48}}\left(\dfrac{1}{R_{52}} + \dfrac{1}{R_{58}} + \dfrac{1}{R_{54}}\right) - V_T'\dfrac{R_{58}}{R_{52}}$ — (Rearranging Eq. (23))

APPENDIX C

Derivation of an Equation for $R_{54}$ Using the Operational Amplifier Equation $V_{36}' = V_R' \cdot A_R' - V_T' \cdot A_T'$

A basic relationship in operational amplifier theory is $V_{36}' = V_R' \cdot A_R' - V_T' \cdot A_T'$, where $A_R'$ is the gain from input R' to output $V_{36}'$, and $A_T'$ is the gain from input T' to output $V_{36}'$. To retain common mode rejection, the gain, $A_T'$, from input T' to output 36' and the gain, $A_R'$, from input R' to output 36' must be the same. This is necessary so that $V_T'$ and $V_R'$ cancel each other out when they are equal. Therefore the following relationship must be present for effective common mode rejection:

(25) $V_{36}' = V_R' \cdot A_R' - V_T' \cdot A_T'$ — (Basic operational amplifier equation, just discussed)

(26) $\dfrac{R_{58}}{R_{52}} = \dfrac{R_{58} \cdot R_{48}}{R_{52} + R_{48}}\left(\dfrac{1}{R_{52}} + \dfrac{1}{R_{58}} + \dfrac{1}{R_{54}}\right)$ — (Setting $A_T' = A_R'$, as discussed above, using Eqs. (24) & (25))

(27) $\dfrac{R_{52} + R_{48}}{R_{52} \cdot R_{48}} = \dfrac{1}{R_{52}} + \dfrac{1}{R_{58}} + \dfrac{1}{R_{54}}$ — (Multiply both sides by $\dfrac{R_{52} + R_{48}}{R_{52} \cdot R_{48}}$)

(28) $\dfrac{1}{R_{52}} + \dfrac{1}{R_{48}} = \dfrac{1}{R_{52}} + \dfrac{1}{R_{58}} + \dfrac{1}{R_{54}}$ — (Simplify left hand side)

(29) $\dfrac{1}{R_{48}} = \dfrac{1}{R_{58}} + \dfrac{1}{R_{54}}$ — (Substract $\dfrac{1}{R_{52}}$ from both sides)

APPENDIX C-continued

Derivation of an Equation for
$R_{54}$ Using the Operational Amplifier Equation
$V_{36}' = V_R' \cdot A_R' - V_T' \cdot A_T'$

(30) $\dfrac{1}{R_{54}} = \dfrac{1}{R_{48}} - \dfrac{1}{R_{58}}$  (Rearrange Eq. (29))

(31) $\dfrac{1}{R_{54}} = \dfrac{R_{58} - R_{48}}{R_{58} \cdot R_{48}}$  (Find common denominator of right sides)

(Invert both sides)

(32) $R_{54} = \dfrac{R_{58} \cdot R_{48}}{R_{58} - R_{48}}$

The physical significance of Eq. (32) is that $R_{58}$ and $R_{54}$ in parallel equals $R_{48}$.

(33) $V_{36}' = \dfrac{R_{58}}{R_{52}} (V_R' - V_T')$  (With $A_R' = A_T' = \dfrac{R_{58}}{R_{52}}$ from Eqs. (24) and (25))

Footnotes:
[3] Note that if $R_{54} = \infty$, then $R_{58} = R_{48}$ as in the prior art case.

APPENDIX D

Derivation of Equations for $R_{48}$, $R_{58}$ and $R_{54}$
in Terms of Specified Differential Gain AD
and $R_{52}$ In accordance with basic operational amplifier theory $1 + \dfrac{R_{46}}{R_{48}}$ = common mode range gain, $A_{CM}$; and $\dfrac{R_{58}}{R_{52}}$ = differential gain $A_D \cdot (A_D = \dfrac{V_{36}'}{V_R' - V_T'})$.

(34) $R_{48} = \dfrac{R_{46}}{A_{CM} - 1} = \dfrac{R_{52}}{A_{CM} - 1}$  (Using the above discussed relationship for $A_{CM}$ and Eq. (15), Appendix A)

(35) $R_{58} = R_{52} A_D$  (The above discussed relationship for $A_D$, rearranged)

(36) $R_{54} = \dfrac{R_{52} A_D \cdot \dfrac{R_{52}}{A_{CM} - 1}}{R_{52} A_D - \dfrac{R_{52}}{A_{CM} - 1}}$  (Substituting Eqs. (34) and (35) into Eq. (32))

(37) $R_{54} = \dfrac{R_{52} \dfrac{A_D}{A_{CM} - 1}}{A_D - \dfrac{1}{A_{CM} - 1}}$  (Divide numerator and denominator of Eq. (36) by $R_{52}$)

(38) $R_{54} = \dfrac{R_{52}}{A_{CM} - 1 - \dfrac{1}{A_D}}$  (Rearrange Eq. (37))

What is claimed is:

1. A differential input-to-single ended output buffer circuit which operates to reject a common mode signal while passing a differential signal, comprising:
   a. a pair of circuit input terminals for receiving a differential input signal upon which may be superimposed an undesired common mode signal, said terminals comprising first and second circuit input terminals,
   b. an operational amplifier having a non-inverting input, an inverting input, and an output, said operational amplifier exhibiting a characteristic of rejecting a common mode signal applied between said non-inverting and said inverting input provided said common mode signal is within a predetermined signal range,
   c. a first voltage divider connected to said first circuit input terminal, said first voltage divider comprising first and second serially connected impedances and being so construed and arranged to apply the signal present at the node between said impedances to the non-inverting input of the operational amplifier to eliminate said undesired common mode signal,
   d. feedback means connected between the output of the operational amplifier and the inverting input of the operational amplifier, and
   e. a second voltage divider connected to said second circuit input terminal, said second voltage divider comprising third and fouth serially connected impedances and being so constructed and arranged to directly apply the signal present at the node between said impedances to the inverting input terminal of the operational amplifier, whereby the predetermined range of common mode signals which are rejected by the operational amplifier is extended.

2. A circuit as defined by claim 1, wherein;
   a. said first voltage divider, said second voltage divider, and said feedback means are mutually cooperative to cause the first and second circuit input terminals to present substantially equal impedances to a common mode signal present at both said first and second input terminals.

3. A circuit as defined by claim 1, wherein:
   a. said first and second impedances comprise first and second resistors serially connected between the first circuit input terminal and ground and the node therebetween is connected to the non-inverting input of the operational amplifier,
   b. said third and fourth series connected impedances comprise third and fourth resistors serially connected between said second input terminal and ground and the node therebetween is connected to said inverting input of said operational amplifier,
   c. said feedback means comprising a fifth resistor,
   d. the magnitudes of said first and third resistors and equal, and
   e. the magnitude of combined parallel resistance of said fourth and fifth resistors and the magnitude of resistance of said second resistor are substantially equal.

4. A circuit as defined by claim 3, wherein;
   a. the ratio of said fifth resistor to said third resistor is chosen to provide a predetermined converter circuit gain.

5. A circuit as defined by claim 1, wherein;
   a. said first and second impedances comprise first and second resistors connected between the first circuit input terminal and ground, and the node therebetween is connected to the non-inverting input of the operational amplifier, and
   b. said third and fourth impedances comprise third and fourth resistors connected between the second circuit input terminal and ground, and the node therebetween is connected to the inverting input of the operational amplifier.

* * * * *